United States Patent
Sturcken

(10) Patent No.: US 6,329,594 B1
(45) Date of Patent: Dec. 11, 2001

(54) INTEGRATED CIRCUIT PACKAGE

(75) Inventor: Keith K. Sturcken, Nokesville, VA (US)

(73) Assignee: BAE Systems Information and Electronic Systems Integration, Inc., Nashua, NH (US)

(*) Notice: Subject to any disclaimer, the term of this patent is extended or adjusted under 35 U.S.C. 154(b) by 0 days.

(21) Appl. No.: 09/007,980

(22) Filed: Jan. 16, 1998

(51) Int. Cl.[7] .................................................. H01L 23/02
(52) U.S. Cl. ............................................. 174/52.4; 257/693
(58) Field of Search .............................. 174/52.2, 52.4, 174/254, 260; 257/730, 693, 668; 361/773, 776, 774, 803, 783, 789

(56) References Cited

U.S. PATENT DOCUMENTS

| | | |
|---|---|---|
| 4,254,445 | 3/1981 | Ho ............................................... |
| 4,371,744 | 2/1983 | Badet et al. ................................. |
| 4,489,364 | 12/1984 | Chance et al. .............................. |
| 5,018,005 * | 5/1991 | Lin et al. ............................. 257/730 |
| 5,396,032 | 3/1995 | Bonham et al. ............................ |
| 5,426,263 | 6/1995 | Potter et al. ................................ |
| 5,452,182 * | 9/1995 | Eichelberger et al. .............. 361/749 |
| 5,533,256 | 7/1996 | Call et al. ................................... |
| 5,764,497 * | 6/1998 | Mizumo ............................... 361/803 |
| 5,936,850 * | 8/1999 | Takahashi et al. ................... 361/784 |

* cited by examiner

Primary Examiner—Dean A. Reichard
Assistant Examiner—Hung V Ngo
(74) Attorney, Agent, or Firm—Swidler Berlin Shereff Freidman, LLP

(57) ABSTRACT

In an integrated circuit package, the density of the I/O leads is increased by implementing the I/O leads by means of flexible circuits. Flexible circuits comprise thin sheets of insulating material on which the I/O leads are formed by photoetching. A conducting film is provided on the opposite side of the insulating film from I/O leads. To make the circuit package, the outer portions of the substrate of a quad pack are trimmed back to the contact pads on each side of the integrated circuit in the quad pack. The conductors of the flexible circuits are then soldered to the contacts of the contact pads.

22 Claims, 5 Drawing Sheets

INTEGRATED CIRCUIT PACKAGE

This invention relates to packaging for an integrated circuit and more particularly to high density circuitry for integrated circuit packages.

BACKGROUND OF THE INVENTION

The evolution of electronic circuitry as used in data processing equipment is toward ever increasing computer performance and ever greater miniaturization. At the integrated circuit module level, this evolution manifests itself in the form of smaller integrated circuit packages with a greater number of input/output leads. Thus, a higher density of input/output leads is needed without compromising the effectiveness of the circuit assembly process or the testing methodology.

The state of the art packaging of integrated circuit modules is represented by the flat pack module which consists of a ceramic or plastic casing body containing the silicon device in the shape of a square in plan view and which has a large number of leads attached to the four edges of the package. The number of leads required for the individual device and how close together the leads can be placed are generally determining factors in the sizes of the modules. With current advanced assembly techniques, the lead pitch of the state of the art for a four-sided quad flat packs has reached a practical limit of 0.015 inches. With modern integrated circuit devices requiring upwards of 300 IO leads, this lead pitch makes the integrated circuit package a determining factor in the overall circuit packaging density. The standard quad flat pack has a surface mounting board employing rigid leads, but with rigid leads, the lead pitch is typically not less than 0.025 inches. As an alternative to the use of rigid leads, wirebonds can be employed for the connecting circuitry. Wirebonds permit significant increases in the IO lead density, but the smaller conductors of the wirebonds are prone to damage and have less than optimum electrical performance.

SUMMARY OF THE INVENTION

The present invention provides another approach for providing the connecting IO leads and increases the density of the leads without sacrificing the electrical performance of the circuit package and also provides a package which can be readily manufactured and can be readily tested. In accordance with the invention, the interconnecting leads are provided by means of flexible circuitry, which comprises a flexible insulating film layer on one side of which the IO leads are formed by a photoetching process and on the other side of which is a conducting sheet or film providing a ground reference for the IO leads. By providing I/O leads with this structure, the lead spacing well below 0.010 inches can be achieved. The flexible circuitry connects directly by solder connections to contact pads which connect directly to circuit points in the integrated circuit. By using the flexible circuitry to make the connection to the contact pads, the size of the integrated circuit package as measured by its surface area or footprint is reduced by over a factor of 2.

DESCRIPTION OF A PREFERRED EMBODIMENT

Figure 1:
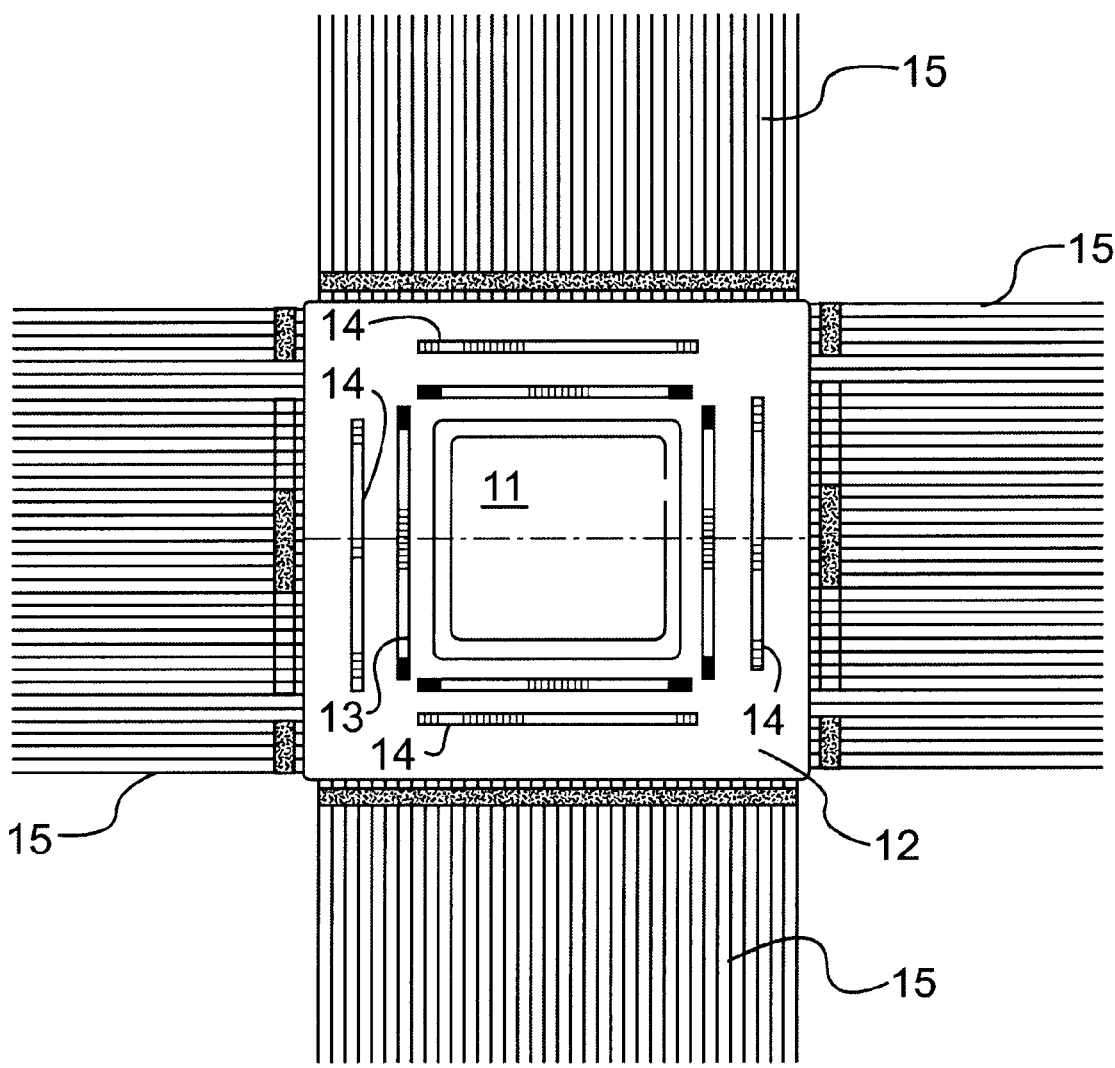
FIG. 1 shows a prior art integrated circuit package known as a quad flat pack.
Figure 2:
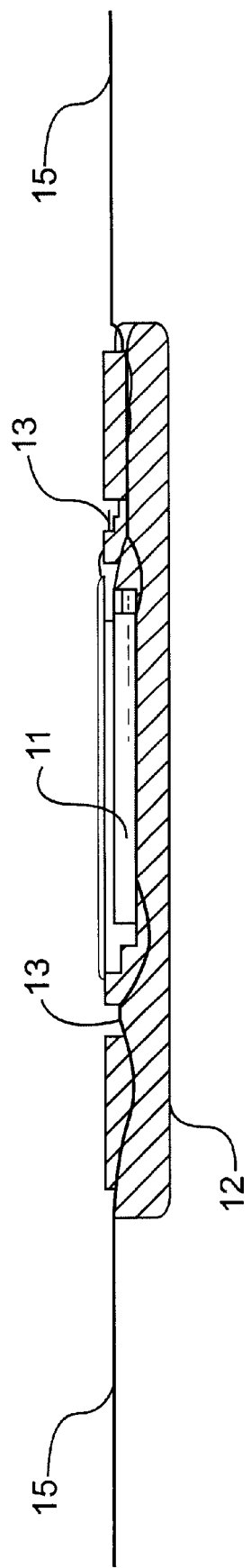
FIG. 2 shows a sectional view in elevation through the circuit package of FIG. 1.
Figure 3:
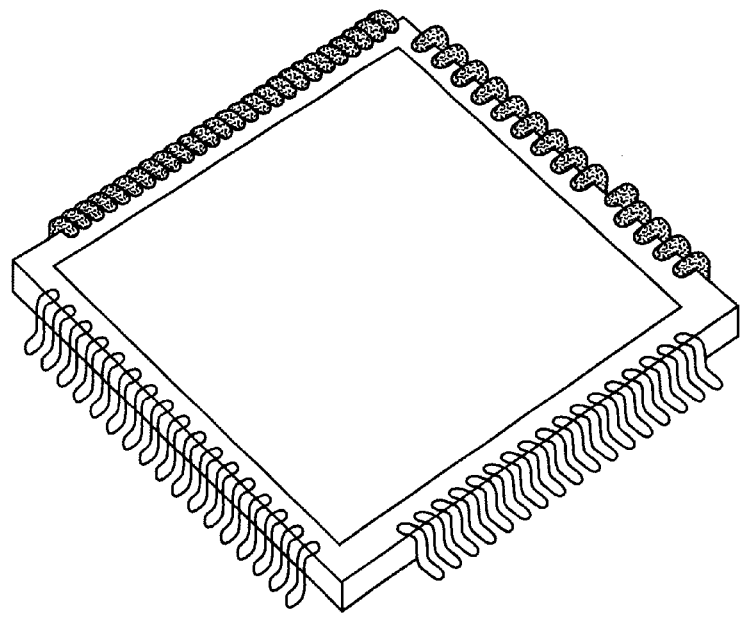
FIG. 3 shows an alternative integrated circuit package of the prior art.

As shown in FIGS. 1 and 2, the quad flat pack comprises an integrated circuit chip 11, having a square shape in top plan view, mounted in a cavity in the center of a plastic or ceramic substrate 12, contact pads 13 each comprising a multiplicity of contacts extend rectilinearly along each side of the integrated circuit chip 11 on the top surface of the substrate 12. The contacts of each contact pad are connected to selected circuit points in the integrated circuit defined in the integrated circuit chip 11 by conductors mounted in the substrate 12. The contacts of the contact pads 13 are severally connected to rigid electrical leads 15 extending in four directions outwardly from the four sides of the quad flat pack. Contact pads 14 containing contacts connected to individual circuit points in the integrate circuit are also provided on the top surface of the substrate outside of the contact pads 13. The contact pads 14 are for making connection to the integrated circuit for testing purposes. Typically, such testing will be performed by a fixture which makes connection to the contacts of the contact pads 14. The I/O leads, instead of extending linearly away from the package as shown in FIG. 1, may be S-shaped rigid conductors providing a direct connection to a printed circuit board on which the quad pack is mounted as shown in FIG. 3. In either case, the length of each side of the quad flat pack at the inboard side of the I/O conductors 15 is typically 1.2 inches.

Figure 4:
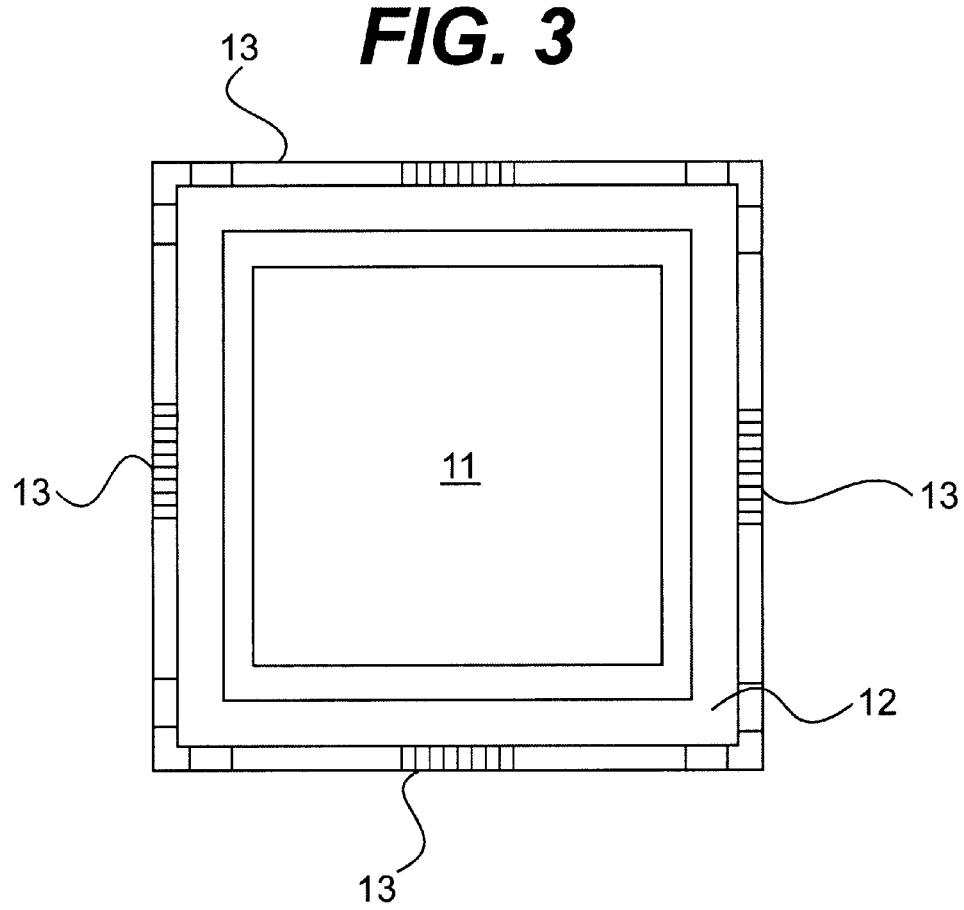
FIG. 4 shows a circuit package component manufactured from the integrated circuit package of FIG. 1 and employed in the present invention.
Figure 5:
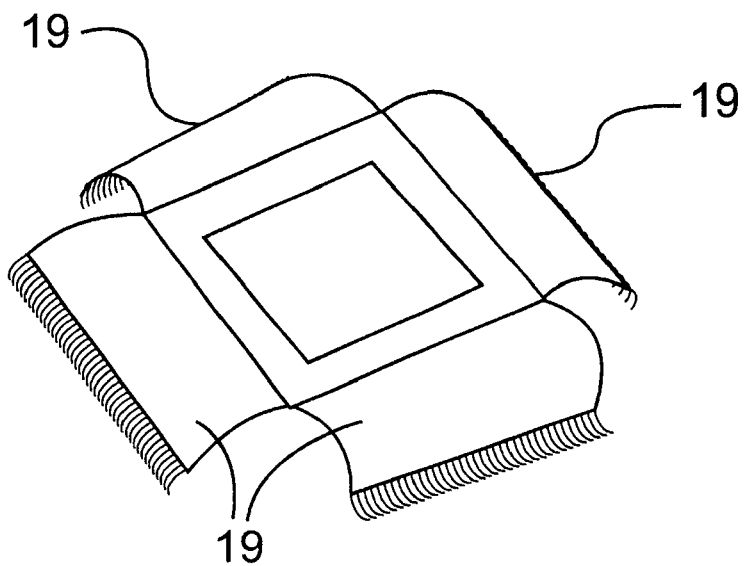
FIG. 5 is a perspective view of the integrated circuit package of the present invention.
Figure 6:
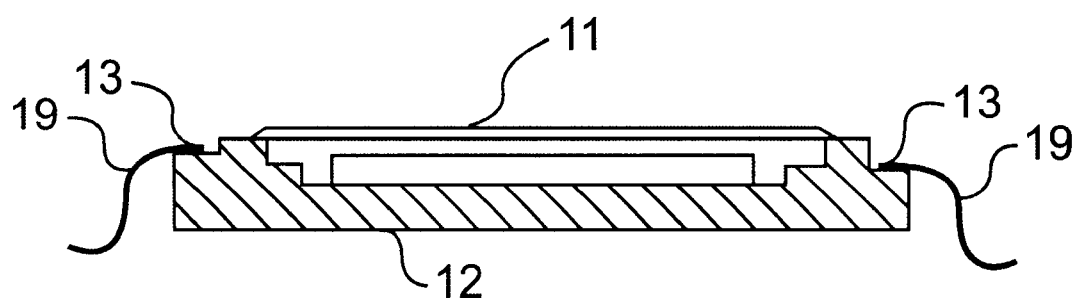
FIG. 6 is a sectional view in elevation through the integrated circuit package of FIG. 5.
Figure 7:
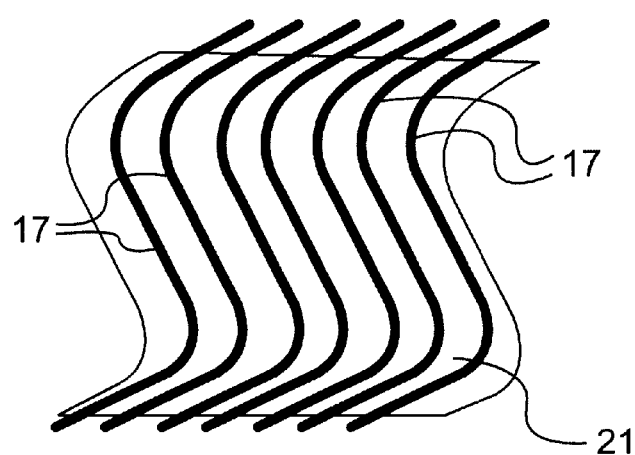
FIG. 7 is a perspective view showing the-bottom side of the flexible circuit employed in the integrated circuit of the present invention as shown in FIGS. 5 and 6.
Figure 8:
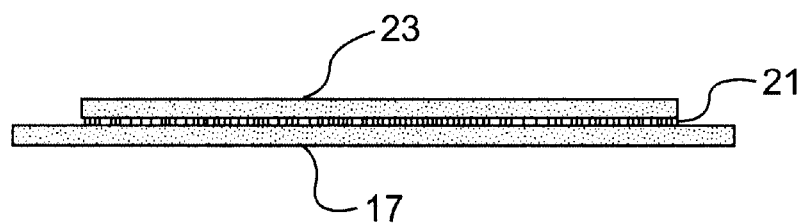
FIG. 8 is a sectional view in elevation of the flexible circuit shown in FIG. 7.

In accordance with the invention, after the integrated circuit has been tested by means of the contact pads 14, the outer portions of the quad pack including the leads 15 and portions of the substrate 12 containing the contact pads 14 are sawed off leaving the structure shown in FIG. 4 comprising the substrate reduced in size, the integrated circuit chip 11, and the four linear contact pads 13 extending on each side of the integrated circuit chip 11. As shown in FIG. 4, the outboard portions of the substrate are cut off just outside of the contact pads 13. The package structure shown in FIG. 4 will have its plan view dimensions reduced to about 0.8 inches. As shown in FIGS. 5 and 6, the conductors formed on flexible circuits 19 are severally connected by soldering to the individual contacts of the contact pads 13. The conductors formed on the flexible circuits thus serve as the I/O conductors for the integrated circuit package. Because the connections to the bond pads are provided by means of flexible circuits, the pitch of the I/O conductors can be substantially reduced. The flexible circuits as shown in FIGS. 7 and 8 each comprise an insulating flexible film sheet 21, which may be polyimide. On the bottom surface of the film sheet, conducting leads 17 are formed in a parallel arrangement extending across the film sheet 21 and projecting beyond each edge of the sheet of film 21. The film sheet 21 has a thickness of about 0.002 inches ranging from 0.0015 to 0.0025 inches. The conducting leads 17, which are defined on the sheet by a photoetching process in the preferred embodiment, are in the form of flat strips 0.006 inches wide placed on 0.012 inch centers thus leaving a space 0.006 inches wide between the conductors and are about 0.0014 inches thick. To provide the structure of the conductors extending beyond the edges of the insulating film sheet the conductors may be formed on the insulation film sheet and the edge of the film sheet cut away. As described above, the conductor pitch provided in the preferred embodiment is 0.012 inches, but through the use of flexible circuits to make the connection to the contact pad 13, the I/O conductor pitch can be reduced to substantially less than 0.01 inches. On the opposite side of the insulating film sheet 21, a conducting sheet 23, also about 0.0014 inches thick, is provided to function as a ground plane for the conductors 17. The use of the ground plane in the form of the conducting sheet 23 controls the impedance of the conductors 17 and reduces the electrical noise induced in and carried by the conductor 17.

Figure 9:
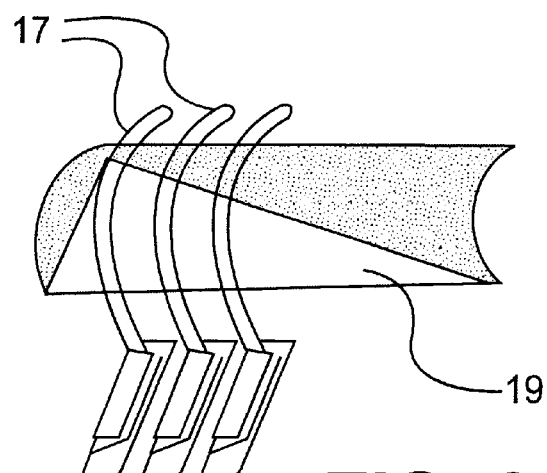
FIG. 9 is an enlarged view showing how the leads of the flexible circuit are soldered to the contacts on the integrated circuit package.

The outboard side of the conductors 17 of the flexible circuits 19 will also be connected to rows of contacts similar to the contact pads 13 by soldering to provide interconnection at the next higher level of assembly. FIG. 9 shows the soldered connections of the conductors 17 to the individual contacts of a contact pad.

The invention as described above thus provides substantially decreased pitch for the IO leads for the integrated circuit package and decreases the size of the integrated circuit package as measured by its footprint area by more than a factor of 2. In addition to these advantages, the invention enables hermetic integrated circuit packages to be provided and allows for the integrated circuit package to be assembled with standard processes and fixtures.

As described above, the preferred embodiment of the invention is manufactured by starting with a conventional quad flat pack and trimming it back to the bond pads defining rows of contacts extending along each of the four sides of the integrated circuit chip as shown in FIG. 2. This manufacturing process enables the integrated circuit to be tested in conventional sockets by means of test point connections made to the integrated circuit package on the portions of the ceramic substrate of the circuit package surrounding the bond pads 13 before these portions are trimmed off. However, the intermediate package component shown in FIG. 2 can be directly manufactured. These and other modifications may be made to the above-described product and method without departing from the spirit and scope of the invention, which is defined in the appended claims.

What is claimed is:

1. An integrated circuit package comprising an integrated circuit chip defining an integrated circuit, a substrate defining a cavity containing said integrated circuit chip enclosed in said cavity, a multiplicity of electrical contacts on said substrate electrically connected to circuit points of said integrated circuit by first conductors mounted in said substrate, said first conductors extending through said substrate to said circuit points, and a sheet of flexible insulating material having electrical second conductors formed on one side of said sheet of flexible insulating material, said electrical second conductors comprising elongated flat strips of conducting material extending beyond an edge of said sheet of flexible insulating material to make electrical contact with said contacts.

2. An integrated circuit package as recited in claim 1, wherein said second conductors are formed on said sheet of flexible insulting material by photoetching.

3. An integrated circuit package as recited in claim 2, wherein said second conductors are formed on said sheet of flexible insulating material extending rectilinearly across said sheet of flexible insulating material parallel to one another, said electrical second conductors having a conductor pitch of no greater than 0.012 inches.

4. An integrated circuit package as recited in claim 1, wherein ends of said electrical second conductors are in electrical contact with said contacts by being soldered to said contacts.

5. An integrated circuit package as recited in claim 1 wherein said edge define an outside boundary of said flexible sheet.

6. An integrated circuit package comprising an integrated circuit chip defining an integrated circuit, a substrate defining a cavity containing said integrated circuit chip enclosed in said cavity, four rows of contacts being defined on said substrate on four lateral sides of said integrated circuit chip, the contacts of each row being electrically connected to circuit points of said integrated circuit by first conductors mounted in said substrate, said first conductors extending through said substrate to said circuit points, and four flexible insulating sheets each having second conductors formed on one side thereof, the conductors of each of said flexible insulating sheets comprising flat strips of conducting material extending beyond an edge of such flexible sheet to make electrical contact with the contacts of one of said rows.

7. An integrated circuit package as recited in claim 6, wherein said second conductors are formed on said flexible insulating sheets by photoetching.

8. An integrated circuit package as recited in claim 7, wherein said conductors extend rectilinearly across said flexible insulating sheets in a parallel arrangement, said second conductors having a conductor pitch of no greater than 0.012 inches.

9. An integrated circuit package as recited in claim 6, wherein the ends of said second conductors are in electrical contact with said contacts by being soldered to said electrical contacts.

10. An integrated circuit package as recited in claim 6 wherein said edge defines an outside boundary of said flexible sheet.

11. An integrated circuit package comprising an integrated circuit chip defining an integrated circuit, a substrate defining a cavity containing said integrated circuit chip enclosed in said cavity, a multiplicity of electrical contacts on said substrate electrically connected to circuit points of said integrated circuit by first conductors mounted in said substrate, said first conductors extending through said substrate to said circuit points, and a sheet of flexible insulating material having electrical second conductors formed on said sheet of flexible insulating material, said second conductors comprising flat strips of conducting material extending beyond an edge of said sheet to make electrical contact with said contacts.

12. An integrated circuit package as recited in claim 11, where said second conductors are formed on said sheet of flexible insulating material by photoetching.

13. An integrated circuit package as recited in claim 12, wherein said second conductors are formed on said sheet of flexible insulating material extending rectilinearly across said sheet parallel to one another, said conductors being formed with a conductor pitch of no greater than 0.012 inches.

14. An integrated circuit package as recited in claim 11, wherein said electrical second conductors are formed on one side of said sheet of flexible insulating material and a flexible electrically conducting sheet is formed on the opposite side of said sheet of flexible insulating material from said conductors.

15. An integrated circuit package as recited in claim 11, wherein the ends of said electrical second conductors are in electrical contact with said contacts by being soldered to said contacts.

16. An integrated circuit package as recited in claim 11 wherein said edge defines an outside boundary of said flexible sheet.

17. An integrated circuit package comprising an integrated circuit chip, a substrate defining a cavity enclosing said integrated circuit chip, four rows of contacts being defined on said substrate on four lateral sides of said integrated circuit chip, the contacts of each row being electrically connected to circuit points of said integrated circuit by first conductors mounted in said substrate, said first conductors extending through said substrate to said circuit points, and four flexible insulating sheets each having second conductors formed thereon, the conductors of each said flexible insulating sheets comprising flat strips of conducting material extending beyond an edge of such flexible insulating sheet to make electrical contact with the contacts of one of said rows.

18. An integrated circuit package as recited in claim 17, wherein the ends of said second conductors are in electrical contact with said contacts by being soldered to said electrical contacts.

19. An integrated circuit package as recited in claim 17 wherein said edge defines an outside boundary of said flexible sheet.

20. An integrated circuit package as recited in claim 17, wherein said second conductors are formed on said flexible insulating sheets by photoetching.

21. An integrated circuit package as recited in claim 17, wherein said second conductors extend rectilinearly across said flexible insulating sheets in a parallel arrangement, said conductors having a conductor pitch of no greater than 0.012 inches.

22. An integrated circuit package as recited in claim 17, wherein each of said flexible insulating sheets has said second conductors formed on one side and has a flexible electrically conducting sheet formed on one side opposite to the side on which the electrical conductors are formed.

\* \* \* \* \*